United States Patent
Ji et al.

(10) Patent No.: US 10,131,982 B2
(45) Date of Patent: Nov. 20, 2018

(54) MASK, MOTHERBOARD, DEVICE AND METHOD FOR MANUFACTURING MASK, AND SYSTEM FOR EVAPORATING DISPLAY SUBSTRATE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Fengli Ji, Beijing (CN); Yinan Liang, Beijing (CN); Shanshan Bai, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/547,348

(22) PCT Filed: Jan. 23, 2017

(86) PCT No.: PCT/CN2017/072223
§ 371 (c)(1),
(2) Date: Jul. 28, 2017

(87) PCT Pub. No.: WO2017/190537
PCT Pub. Date: Nov. 9, 2017

(65) Prior Publication Data
US 2018/0216221 A1 Aug. 2, 2018

(30) Foreign Application Priority Data
May 5, 2016 (CN) ..................... 2016 2 0398823 U

(51) Int. Cl.
*H01L 51/56* (2006.01)
*C23C 14/04* (2006.01)
(Continued)

(52) U.S. Cl.
CPC ............ *C23C 14/042* (2013.01); *C23C 14/12* (2013.01); *C23C 14/24* (2013.01); *H01L 27/124* (2013.01);
(Continued)

(58) Field of Classification Search
None
See application file for complete search history.

(56) References Cited

U.S. PATENT DOCUMENTS 4,904,087 A * 2/1990 Harvey ................. G03F 9/7076
250/548
6,303,253 B1 * 10/2001 Lu ............................. G03F 1/36
430/5
(Continued)

FOREIGN PATENT DOCUMENTS

| CN | 203034082 U | 7/2013 |
|---|---|---|
| CN | 205556762 U | 9/2016 |
| JP | 4380326 B2 | 12/2009 |

OTHER PUBLICATIONS

PCT (CN) International Search Report, Application No. PCT/CN2017/072223, dated May 5, 2017, 8 pps.
(Continued)

*Primary Examiner* — Michael Lebentritt
(74) *Attorney, Agent, or Firm* — Armstrong Teasdale LLP

(57) ABSTRACT

A mask includes a graphic mask layer having a plurality of graphic mask blocks mutually spaced apart and arranged in parallel, and a covering mask layer having a plurality of covering mask blocks mutually spaced apart and arranged in parallel. The covering mask block covers a gap between
(Continued)

adjacent graphic mask blocks. The graphic mask block includes an effective region, an ineffective region, and a marginal region between the effective region and the ineffective region, wherein each region has a plurality of pixel shaping openings, and the covering mask block further covers the pixel shaping openings of the ineffective regions of the adjacent graphic mask blocks. The motherboard is used for manufacturing the mask. The device for manufacturing mask comprises the motherboard, a base table, a stretcher and a welding machine. The system for evaporating the display substrate includes an evaporator and the mask.

16 Claims, 3 Drawing Sheets

(51) Int. Cl.
    C23C 14/24    (2006.01)
    C23C 14/12    (2006.01)
    H01L 27/12    (2006.01)
    H01L 51/00    (2006.01)

(52) U.S. Cl.
    CPC ...... *H01L 27/1288* (2013.01); *H01L 51/0011* (2013.01); *H01L 51/56* (2013.01)

(56)     References Cited

U.S. PATENT DOCUMENTS

| 6,372,391 | B1* | 4/2002 | Wolfe | B82Y 10/00 |
| | | | | 430/296 |
| 6,576,376 | B1* | 6/2003 | Kim | G03F 1/32 |
| | | | | 430/5 |
| 7,001,693 | B2* | 2/2006 | Liebmann | G03F 1/36 |
| | | | | 430/30 |
| 7,055,126 | B2* | 5/2006 | Gallatin | G03F 1/36 |
| | | | | 716/53 |
| 7,247,574 | B2* | 7/2007 | Broeke | G03F 1/36 |
| | | | | 257/E21.023 |
| 7,269,817 | B2* | 9/2007 | Heng | G03F 1/36 |
| | | | | 716/132 |
| 7,308,673 | B2* | 12/2007 | Melvin, III | G03F 1/28 |
| | | | | 430/5 |
| 7,455,938 | B2* | 11/2008 | Terhune | G03F 1/36 |
| | | | | 430/311 |
| 7,506,299 | B2* | 3/2009 | Socha | G03F 1/36 |
| | | | | 716/132 |
| 7,523,027 | B2* | 4/2009 | Chang | G03F 1/26 |
| | | | | 703/13 |
| 7,562,333 | B2* | 7/2009 | Parikh | G03F 1/36 |
| | | | | 430/5 |
| 7,594,199 | B2* | 9/2009 | Socha | G03F 1/36 |
| | | | | 716/53 |
| 8,127,257 | B2* | 2/2012 | Kawakami | G03F 1/36 |
| | | | | 430/311 |
| 9,316,901 | B2* | 4/2016 | Chen | G03F 1/36 |
| 2003/0228541 | A1* | 12/2003 | Hsu | G03F 1/26 |
| | | | | 430/296 |
| 2004/0080732 | A1* | 4/2004 | Kuroda | G03F 7/2014 |
| | | | | 355/53 |
| 2005/0170075 | A1* | 8/2005 | Chung | C23C 14/042 |
| | | | | 427/66 |
| 2007/0035242 | A1* | 2/2007 | Lee | C09D 11/30 |
| | | | | 313/506 |
| 2007/0287214 | A1* | 12/2007 | Huang | G02B 26/0841 |
| | | | | 438/50 |
| 2011/0014572 | A1* | 1/2011 | Lal | G03F 1/20 |
| | | | | 430/296 |
| 2011/0157575 | A1 | 6/2011 | Lee | |
| 2012/0177812 | A1* | 7/2012 | Uetake | C23C 14/042 |
| | | | | 427/66 |
| 2016/0221017 | A1* | 8/2016 | Huang | B29C 43/02 |
| 2016/0342080 | A1* | 11/2016 | Beyer | G03F 1/72 |
| 2017/0155052 | A1* | 6/2017 | Zhang | H01L 51/0011 |

OTHER PUBLICATIONS

PCT (CN) Written Opinion, Application No. PCT/CN2017/072223, dated May 5, 2017 10 pps.: with English translation.

\* cited by examiner

MASK, MOTHERBOARD, DEVICE AND METHOD FOR MANUFACTURING MASK, AND SYSTEM FOR EVAPORATING DISPLAY SUBSTRATE

CROSS REFERENCE TO RELATED APPLICATIONS

The present patent application is a National Stage Entry of PCT/CN2017/072223 filed on Jan. 23, 2017, which claims the priority of Chinese patent application No. 201620398823.9 filed on May 5, 2016, the disclosures of which are hereby incorporated herein in their entirety as part of the present application.

BACKGROUND

Embodiments of the present disclosure relate to the field of display technology, and in particular, to a mask, a motherboard, a device and method for manufacturing the mask, and a system for evaporating a display substrate.

An organic light emitting diode (OLED) display panel is a panel that uses OLEDs as display pixels. Compared to a traditional liquid crystal panel, an OLED itself emits light rather than using a backlight source. The principle of light emission from OLED utilizes the phenomenon that organic semiconductor material and luminescent material are driven by an electric field to emit light through carrier injection and recombination. Specifically, in an OLED, an indium tin oxide (ITO) transparent electrode and a metal electrode are usually used as an anode and a cathode of the OLED, respectively. Driven by a certain voltage, electrons and holes are injected from the cathode and the anode respectively into an electron transport layer and a hole transport layer. Electrons and holes migrate through the electron transport layer and the hole transport layer respectively to a light-emitting layer and meet each other in the light-emitting layer to form excitons. The excitons excite luminescent molecules which emit visible light through radiative relaxation.

OLED display panels can be mainly divided into passive matrix (PM) type and active matrix (AM) type. In a PM type panel, cathodes and anodes form a matrix and OLED pixels are lighted in a scanning manner. In an AM type panel, a complete cathode layer is usually provided, and an array of thin film transistors (TFTs) is overlaid on an anode layer to determine which pixels emit light and thus determine the composition of an image.

For both types of panels described above, OLED light emitting devices are manufactured by evaporating organic material onto a substrate (e.g., a TFT substrate in an AM type panel). The evaporation of organic material usually requires the use of a mask such as a fine metal mask (FMM). The mask is usually welded onto a metal frame and placed in an evaporator when in use. The component formed by welding the mask and the metal frame together is usually referred to as a mask frame assembly (MFA). Since the mask has a significant influence on the display performance of an OLED light-emitting layer obtained by evaporation, there is a need to continuously improve the performance of the mask.

BRIEF DESCRIPTION

Embodiments of the present disclosure provide a mask, a motherboard, a device and method for manufacturing the mask, and a system for evaporating a display substrate, which can mitigate the darkening in luminance at left and right sides of an OLED display panel and improve the yield.

According to a first aspect of the present disclosure, there is provided a mask including a graphic mask layer having a plurality of graphic mask blocks mutually spaced apart and arranged in parallel, and a covering mask layer having a plurality of covering mask blocks mutually spaced apart and arranged in parallel. The covering mask block covers a gap between adjacent graphic mask blocks. The graphic mask block comprises an effective region, an ineffective region, and a marginal region between the effective region and the ineffective region. The effective region, the ineffective region and the marginal region each have a plurality of pixel shaping openings, and the covering mask block further covers the pixel shaping openings of the ineffective regions of the adjacent graphic mask blocks.

According to the above-described configuration, since the ineffective region and the marginal region of the graphic mask block have a plurality of pixel shaping openings, on one hand, in the process of manufacturing the graphic mask block, the degrees at which the edge and the inside of the effective region are etched become more uniform such that evaporation angles become more uniform. On the other hand, in the process of evaporating organic material, magnetic force distributions at the edge and the inside of the effective region become more uniform such that the thickness of the organic material layer obtained through the evaporation becomes more uniform, thereby mitigating the darkening in luminance at left and right sides of a display panel and improving the yield. In addition, since the covering mask block further covers the pixel shaping openings of the ineffective regions of the adjacent graphic mask blocks, the organic material can be avoided from being evaporated to the region where the organic material layer is not desired to be provided.

According to a second aspect of the present disclosure, the plurality of pixel shaping openings of the effective region are arranged in a form of a plurality of pixel shaping regions mutually spaced apart. The mask further includes a supporting mask layer having a plurality of supporting mask blocks mutually spaced apart and arranged in parallel. The supporting mask block is arranged perpendicularly to a length direction of the graphic mask block, and a position of the supporting mask block corresponds to a gap between adjacent pixel shaping regions.

According to the above-described configuration, since the supporting mask block supports the graphic mask block, the drooping of the graphic mask layer can be reduced. In addition, since the position of the supporting mask block corresponds to the gap between adjacent pixel shaping regions, the supporting mask block does not influence the evaporation of the organic material.

According to a third aspect of the present disclosure, the marginal region has one or two columns of pixel shaping openings.

According to a fourth aspect of the present disclosure, one of the covering mask block and the graphic mask block has at least one positioning opening, or each of the covering mask block and the graphic mask block has at least one positioning opening.

According to the above-described configuration, since the covering mask block has at least one positioning opening, in the process of manufacturing the mask, the covering mask block can be accurately positioned to cover the pixel shaping openings of the ineffective regions of adjacent graphic mask blocks by using the corresponding positioning pattern on the motherboard. Since the portion provided with the at least one positioning opening can be cut off after the mask is manufactured, this feature is an optional feature of the disclosed mask as a finished product.

According to a fifth aspect of the present disclosure, the pixel shaping openings of the ineffective region and the marginal region have a same structure, size and arrangement as the pixel shaping openings of the effective region.

According to the above configuration, since the pixel shaping openings of the ineffective region and the marginal region have the same structure, size and arrangement as the pixel shaping openings of the effective region, more uniform evaporation angles and magnetic force distributions can be obtained, thereby better mitigating the darkening in luminance at left and right sides of a display panel and improving the yield.

According to a sixth aspect of the present disclosure, the mask further comprises a mask frame on which the graphic mask layer and the covering mask layer are provided.

According to a seventh aspect of the present disclosure, the mask further comprises a mask frame on which the graphic mask layer, the covering mask layer and the supporting mask layer are provided.

According to an eighth aspect of the present disclosure, there is provided a motherboard for positioning purpose in a process of manufacturing the mask according to the above first aspect. At least one of the following is provided on the motherboard, at least one first positioning pattern provided for each graphic mask block to position the graphic mask block, and at least one second positioning pattern provided for each covering mask block to position the covering mask block to cover the pixel shaping openings of the ineffective regions of adjacent graphic mask blocks.

According to the above-described configuration, since the first positioning pattern and the second positioning pattern are provided on the motherboard, the graphic mask block and the covering mask block can be accurately positioned in the process of manufacturing the mask.

According to a ninth aspect of the present disclosure, the at least one first positioning pattern or the at least one second positioning pattern comprises at least two dot patterns that are mutually spaced apart and are used for alignment with at least two corresponding holes in the graphic mask block or the covering mask block.

According to a tenth aspect of the present disclosure, there is provided a device for manufacturing the mask according to the above sixth aspect. The device includes the motherboard according to the above eighth or ninth aspect, configured to position the covering mask layer and the graphic mask layer, a base table configured to support the motherboard and the mask frame, a stretcher configured to perform a stretching treatment on the covering mask layer and the graphic mask layer, and a welding machine configured to weld the positioned and stretched covering mask layer and graphic mask layer onto the mask frame, respectively.

According to an eleventh aspect of the present disclosure, there is provided a system for evaporating a display substrate. The system comprises an evaporator, and the mask according to any one of the above first to seventh aspects.

According to the above-described configuration, since the mask according to any one of the first to seventh aspects is used, the thickness of the organic material layer obtained by the evaporation becomes more uniform, thereby mitigating the darkening in luminance at left and right sides of a display panel and improving the yield.

According to a twelfth aspect of the present disclosure, there is provided a method for manufacturing the mask according to the above sixth aspect. The method includes positioning, by the motherboard according to the above eighth or ninth aspect, the covering mask layer and the graphic mask layer, performing, by a stretcher, a stretching treatment on the covering mask layer and the graphic mask layer, and welding, by a welding machine, the positioned and stretched covering mask layer and graphic mask layer onto the mask frame, respectively.

BRIEF DESCRIPTION OF THE DRAWINGS

In order to illustrate the technical solutions of embodiments of the present disclosure more clearly, the drawings of embodiments will be introduced briefly below. Apparently, the schematic structure diagrams in the following drawings are not necessarily drawn to scale, but exhibit various features in a simplified form. Furthermore, the drawings in the following description relate merely to some embodiments of the present disclosure, but should not be construed as limiting the present disclosure.

DETAILED DESCRIPTION

In order to make the technical solutions and advantages of embodiments of the present disclosure apparent, the technical solutions of embodiments of the present disclosure will be described clearly and completely hereinafter in conjunction with the drawings of embodiments of the present disclosure. Apparently, embodiments described herein are merely a part of but not all embodiments of the present disclosure. Based on embodiments of the present disclosure described herein, those skilled in the art can obtain other embodiments without any creative work, which should be within the scope of the present disclosure.

Currently, in an OLED display panel, since the thickness of the organic material layer obtained by performing evaporation with the existing mask is not uniform, the darkening occurs in luminance at left and right sides of the OLED display panel, thereby reducing the panel yield.

The embodiments of the present disclosure provide a mask, a motherboard, a device and method for manufacturing the mask, and a system for evaporating a display substrate, which can mitigate the darkening in luminance at left and right sides of an OLED display panel and improve the yield. In addition, the principle of the present disclosure can be applied to an AM type display panel or to a PM type display panel. Hereinafter, the mask, the motherboard, the device and method for manufacturing the mask, and the system for evaporating the display substrate of the present disclosure will be described in detail with reference to corresponding embodiments.

I. Mask

Figure 1:
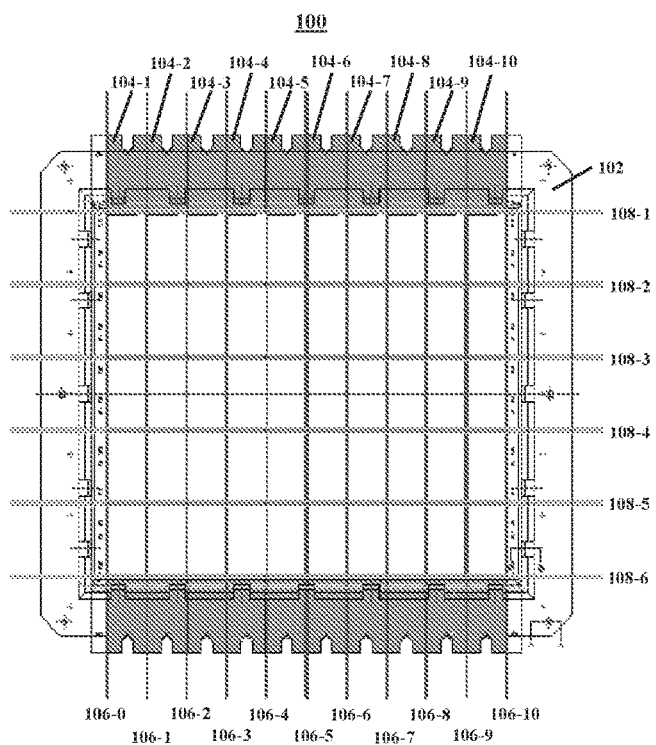
FIG. 1 is a schematic structural view of a mask to which an embodiment of the present disclosure may be applied.

FIG. 1 is a schematic structural view of a mask to which an embodiment of the present disclosure may be applied. As shown in FIG. 1, a mask 100 comprises a mask frame 102, and a graphic mask layer 104, a covering mask layer 106 and a supporting mask layer 108 fixed (e.g., welded) on the mask frame 102. The mask frame 102 acts as a supporting frame and can be made of metal material such as stainless steel. The graphic mask layer 104 is used for evaporating organic material on a substrate (e.g., a TFT substrate in an AM type panel) to form display pixels, and can be made of metal material such as stainless steel. The graphic mask layer 104 has a plurality of graphic mask blocks 104-1, 104-2, . . . , 104-10 mutually spaced apart and arranged in parallel. Although 10 graphic mask blocks are shown in FIG. 1, this is merely an exemplary example. The number of graphic mask blocks can take any appropriate value depending on the actual application. Each graphic mask block may have a plurality of pixel shaping regions (see FIG. 5), and each pixel shaping region may have a plurality of pixel shaping openings.

Since there are a gap between adjacent graphic mask blocks as well as a gap between the outermost graphic mask block and the mask frame (see FIG. 5), if no treatment is performed, the organic material will be evaporated onto the substrate. To this end, the covering mask layer 106 has a plurality of covering mask blocks 106-0, 106-1, . . . , 106-10 mutually spaced apart and arranged in parallel to cover the gaps. Similar to the graphic mask blocks, the number of covering mask blocks can take any appropriate value depending on the actual application. The covering mask layer 106 may be made of metal material such as stainless steel.

In addition, since the length of the graphic mask layer may be large (for example, in the case of a mask used in the G5.5 production line), the drooping of the graphic mask layer occurs. To this end, the supporting mask layer 108 has a plurality of supporting mask blocks 108-1, 108-2, . . . , 108-6 mutually spaced apart and arranged in parallel. The supporting mask block is arranged perpendicularly to a length direction of the graphic mask block, and a position of the supporting mask block corresponds to a gap between adjacent pixel shaping regions. The gap between two adjacent supporting mask blocks may correspond to one pixel shaping region or may correspond to more than one pixel shaping region. Thus, on one hand, the drooping of the graphic mask layer can be reduced due to the supporting action of the supporting mask blocks, and on the other hand, since the position of the supporting mask block corresponds to the gap between adjacent pixel shaping regions, the supporting mask block does not influence the evaporation of the organic material. Similar to the graphic mask blocks, the number of supporting mask blocks can take any suitable value depending on the actual application. The supporting mask layer 108 may be made of metal material such as stainless steel. In addition, the metal materials used to form the above mask frame 102, the graphic mask layer 104, the covering mask layer 106, and the supporting mask layer 108 may be the same as or different from each other.

In the example shown in FIG. 1, the mask comprises a mask frame, which in this case is generally referred to as the MFA mentioned above. It should be noted, however, that the structure of the mask to which embodiments of the present disclosure may be applied is not limited to the example shown in FIG. 1. As another example, the mask may comprise a graphic mask layer and a covering mask layer only, and the graphic mask layer and the covering mask layer may be fixed together in any suitable way such as welding. As yet another example, the mask may comprise a graphic mask layer, a covering mask layer and a supporting mask layer only, and the graphic mask layer, the covering mask layer and the supporting mask layer may be fixed together in any suitable way such as welding.

Figure 2:
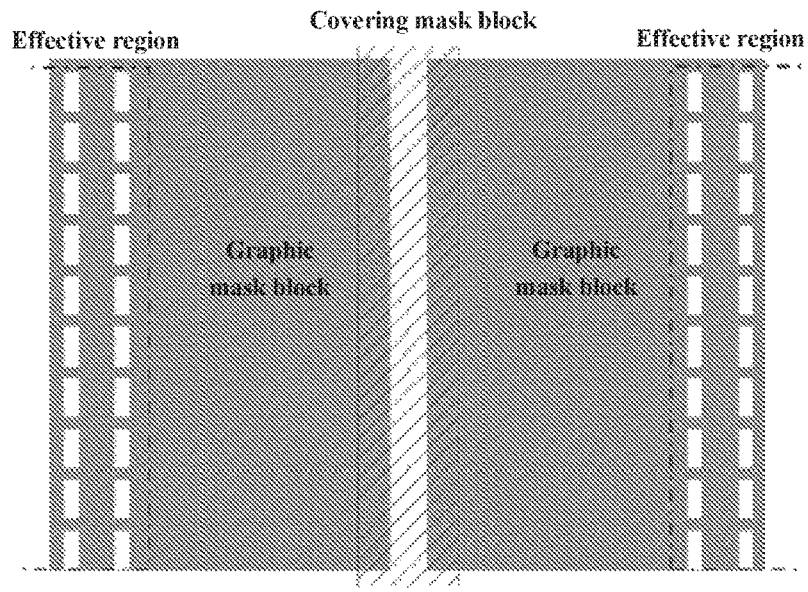
FIG. 2 is a schematic structural view of graphic mask blocks and covering mask blocks in the prior art.

FIG. 2 is a schematic structural view of a graphic mask block and a covering mask block in the prior art. As shown in FIG. 2, the prior art graphic mask block comprises an effective region having a plurality of pixel shaping openings, wherein the plurality of pixel shaping openings may be arranged in a form of a plurality of pixel shaping regions mutually spaced apart as mentioned above. Although not shown in FIG. 2, the prior art graphic mask block may have dummy pixel shaping openings on the outside of the edge of the effective region. Since the organic material may be evaporated outside the effective region on the substrate when the number of dummy openings is large, the number of the prior art dummy openings is very small (usually one column of or two columns of pixel shaping openings). In addition, as shown in FIG. 2, the prior art covering mask block covers only the gap between adjacent graphic mask blocks.

In the display panel obtained by performing evaporation with the prior art mask, the darkening in luminance at left and right sides may occur. There are mainly two reasons for this phenomenon. One reason is that in the case of the current narrow bezel display, the number of dummy openings in the graphic mask layer is small. In the process of evaporation at the graphic mask layer, since the stress distribution at the interface between the pixel shaping openings and the raw material is not uniform, the difference between magnetic forces at the effective region and at the raw material region is too large, resulting in a large attraction strength at the edge of the graphic mask layer and thus an evaporation shadow is generated. The second reason is that the number of dummy openings in the graphic mask layer is small. In the process of manufacturing the graphic mask layer, the etchant flows from the edge to the inside of the effective region such that the degree of etching at the edge is different from that at the inside, and the material etched away from the edge of the effective region is more than the material etched away from the center of the effective region. Thus, the evaporation angle is reduced, leading to an increase in the evaporation shadow. Ultimately, the thickness of the organic material evaporated on both sides of the display panel is smaller than that in the center. Thus, the luminance on the left and right sides of the panel is darken.

Figure 3:
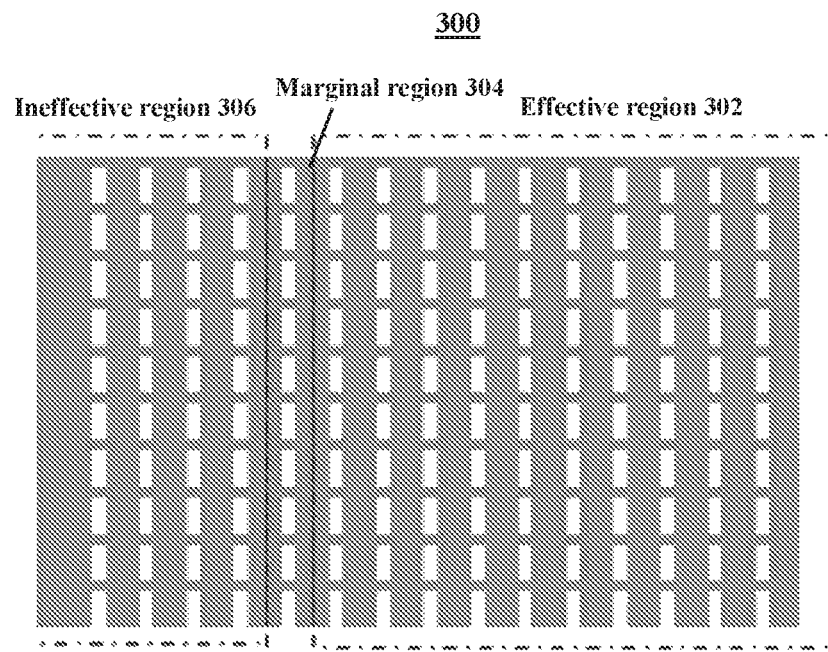
FIG. 3 is a schematic structural view of a graphic mask block according to an embodiment of the present disclosure.

FIG. 3 is a schematic structural view of a graphic mask block according to an embodiment of the present disclosure. As shown in FIG. 3, the graphic mask block 300 comprises an effective region 302, an ineffective region 306, and a marginal region 304 located between the effective region 302 and the ineffective region 306. As previously described, the effective region 302 has a plurality of pixel shaping openings, which may be arranged in a form of a plurality of pixel shaping regions mutually spaced apart as mentioned above. The marginal region 304 and the ineffective region 306 each have a plurality of pixel shaping openings. To avoid the organic material from being evaporated outside the effective region of the substrate, the pixel shaping openings in the marginal region 304 and the ineffective region 306 are dummy openings. The number of pixel shaping openings in the marginal region 304 is defined so as not to influence the outside of the effective region of the substrate obtained by evaporation (for example, so as not to influence the conductive characteristics of the outside region). Usually, there is one column of or two columns of pixel shaping openings. The pixel shaping openings in the ineffective region 306 influence the outside of the effective region of the substrate obtained by evaporation, and the number thereof can be determined based on the improvement of the display performance of the display panel obtained by evaporation. For example, there may be several or tens of columns of pixel shaping openings. It should be noted that, in the example shown in FIG. 3, the pixel shaping opening is a slot-type full etch opening. However, the present disclosure is not limited to this example, and the pixel shaping opening may also take any other suitable form depending on the actual application.

The graphic mask block 300 may be manufactured by using any existing techniques for forming FMM. For example, the graphic mask block 300 may be manufactured by sequentially carrying out coating of photoresist, exposure with a photolithographic mask, development with a developing solution, etching with an etchant, and peeling the photoresist.

In the example shown in FIG. 3, the pixel shaping openings of the ineffective region 306 and the marginal region 304 have the same structure, size, and arrangement as the pixel shaping openings of the effective region 302. However, the present disclosure is not limited to the example shown in FIG. 3. As another example, the pixel shaping openings of the ineffective region 306 and the marginal region 304 may also have a structure, size, and arrangement different from the pixel shaping openings of the effective region 302. Furthermore, the structure, size and arrangement of the pixel shaping openings of the ineffective region 306 may be the same as or different from those of the marginal region 304.

In this way, on one hand, in the process of manufacturing the graphic mask block, the degrees at which the edge and the inside of the effective region are etched become more uniform, such that the evaporation angles become more uniform. On the other hand, in the process of evaporating the organic material, the distribution of magnetic forces at the edge and at the inside of the effective region becomes more uniform, such that the thickness of the organic material layer obtained by evaporation becomes more uniform. Thereby, the darkening in luminance at left and right sides of a display panel can be mitigated and the yield can be improved.

Figure 4:
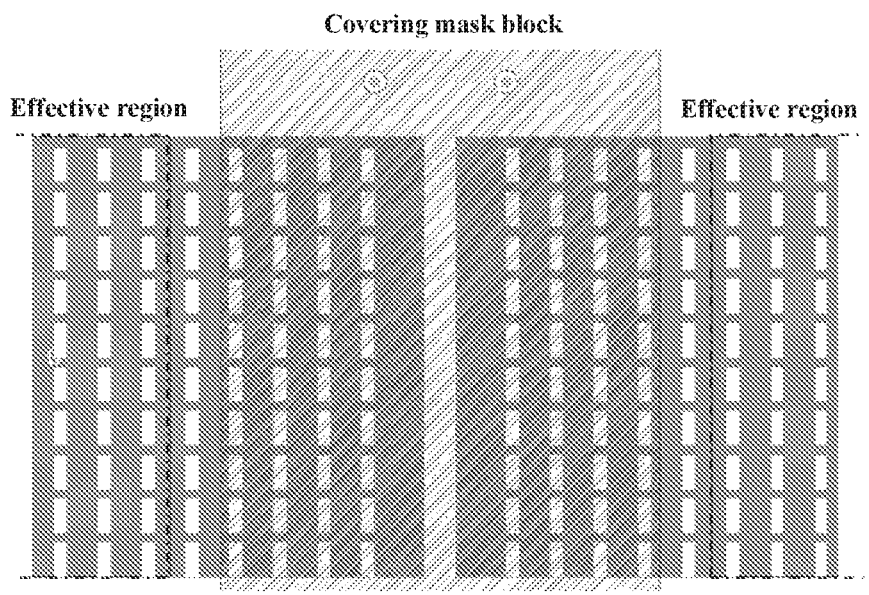
FIG. 4 is a schematic structural view of a graphic mask block and a covering mask block according to an embodiment of the present disclosure.

FIG. 4 is a schematic structural view of a graphic mask block and a covering mask block according to an embodiment of the present disclosure. As described above, the pixel shaping openings in the ineffective region 306 influence the outside of the effective region of the substrate obtained by evaporation. Therefore, as shown in FIG. 4, the covering mask covers the pixel shaping openings of the ineffective regions of adjacent graphic mask blocks. Since the pixel shaping openings in the marginal region do not influence the outside of the effective region of the substrate obtained by evaporation, there is no need for the covering mask block to cover the marginal region. Moreover, leaving the marginal region may also prevent the covering mask from covering the effective region (due to, for example, the precision of the processes) and then influencing the evaporation of the organic material.

As described above, the prior art covering mask block covers only the gap between adjacent two graphic mask blocks, so the requirement for the positioning accuracy of the covering mask block is not high. However, the covering mask block shown in FIG. 4 is to block the pixel shaping openings of the ineffective region, which requires a higher positioning accuracy for the covering mask block. Thus, as shown in FIG. 4, the covering mask block also has two positioning holes mutually spaced apart for alignment with corresponding positioning patterns on a motherboard for positioning purpose, such as mother glass, so as to accurately position the covering mask block to cover the pixel shaping openings of the ineffective region. In addition, since it is required to perform accurate positioning between the covering mask block and the graphic mask block, the graphic mask block also has two positioning holes mutually spaced apart for alignment with corresponding positioning patterns on the motherboard for positioning purpose (see FIG. 5).

It should be noted that the present disclosure is not limited to the example shown in FIG. 4. As another example, the covering mask block and the graphic mask block may each have only one strip-like positioning opening. Accordingly, the motherboard, for positioning purposes, may have a corresponding strip-like positioning pattern for alignment with the positioning opening. That is, each of the covering mask block and the graphic mask block has at least one positioning opening. In addition, since the portions of the covering mask block and the graphic mask block provided with the positioning opening can be cut off after the mask blocks are manufactured, the positioning opening is an optional feature of the mask as a finished product.

As described above, the structure of the mask to which an embodiment of the present disclosure may be applied is not limited to the example shown in FIG. 1. As another example, the mask may comprise only a graphic mask layer and a covering mask layer, and the graphic mask layer and the covering mask layer may be fixed together in any suitable manner such as welding. That is, the first embodiment of the present disclosure provides a mask including a graphic mask layer having a plurality of graphic mask blocks mutually spaced apart and arranged in parallel, and a covering mask layer having a plurality of covering mask blocks mutually spaced apart and arranged in parallel. The covering mask block covers a gap between adjacent graphic mask blocks. The graphic mask block comprises an effective region, an ineffective region, and a marginal region between the effective region and the ineffective region. The effective region, the ineffective region and the marginal region each have a plurality of pixel shaping openings, and the covering mask block further covers the pixel shaping openings of the ineffective regions of the adjacent graphic mask blocks.

As described above, as yet another example, the mask may comprise a graphic mask layer, a covering mask layer and a supporting mask layer only, and the graphic mask layer, the covering mask layer and the supporting mask layer may be fixed together in any suitable manner such as welding. That is, the second embodiment of the present disclosure provides a mask including a graphic mask layer having a plurality of graphic mask blocks mutually spaced apart and arranged in parallel, and a covering mask layer having a plurality of covering mask blocks mutually spaced apart and arranged in parallel. The covering mask block covers a gap between adjacent graphic mask blocks. The graphic mask block comprises an effective region, an ineffective region, and a marginal region between the effective region and the ineffective region. The effective region, the ineffective region and the marginal region each have a plurality of pixel shaping openings, and the covering mask block further covers the pixel shaping openings of the ineffective regions of the adjacent graphic mask blocks. The plurality of pixel shaping openings of the effective region are arranged in a form of a plurality of pixel shaping regions mutually spaced apart. The mask further comprises a supporting mask layer having a plurality of supporting mask blocks mutually spaced apart and arranged in parallel. The supporting mask block is arranged perpendicularly to a length direction of the graphic mask block, and a position of the supporting mask block corresponds to a gap between adjacent pixel shaping regions.

In addition, as previously described with respect to FIG. 1, the mask may include a mask frame. That is, the third embodiment of the present disclosure provides a mask that further includes a mask frame on which the graphic mask layer and the covering mask layer are provided. Further, the fourth embodiment of the present disclosure provides a mask that further includes a mask frame on which the graphic mask layer, the covering mask layer, and the supporting mask layer are provided.

II. Motherboard

Figure 5:
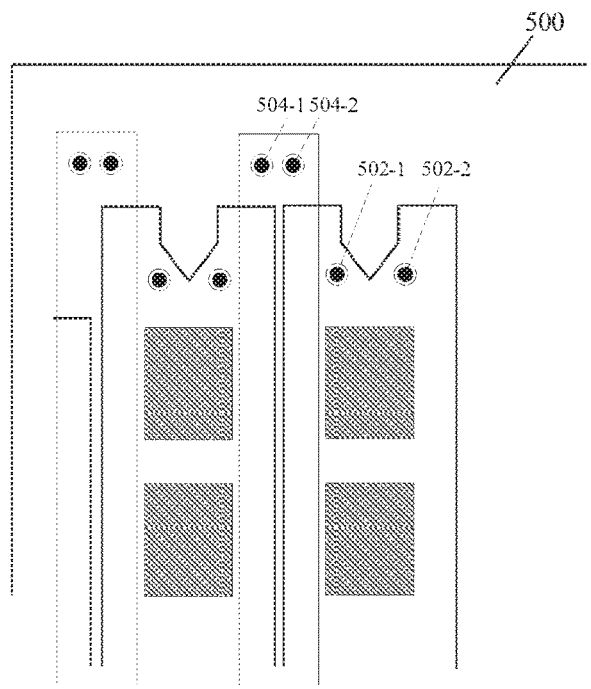
FIG. 5 is a schematic structural view of a motherboard according to an embodiment of the present disclosure.

FIG. 5 is a schematic structural view of a motherboard according to an embodiment of the present disclosure. As shown in FIG. 5, on the motherboard 500, two dots 502-1 and 502-2, mutually spaced apart, are provided with respect to each graphic mask block and are used for alignment with two holes in the graphic mask block to carry out positioning. In addition, on the motherboard 500, two dots 504-1 and 504-2, mutually spaced apart, are provided with respect to each covering mask block and are used for alignment with two holes in the covering mask block such that the covering mask block is positioned to cover pixel shaping openings of the ineffective region of the graphic mask block. The positioning patterns 502-1, 502-2, 504-1 and 504-2 can be implemented by depositing, for example, metal material to predetermined positions on the mother glass using any existing deposition processes.

Likewise, the present disclosure is not limited to the example shown in FIG. 5. As another example, the shape of the positioning pattern is not limited to dot, but may also take any other suitable shape such as square, triangle and so on. As yet another example, only one strip-like positioning pattern may be provided on the motherboard with respect to each graphic mask block and may be used for alignment with a corresponding strip-like positioning opening in the graphic mask block. As yet another example, only one strip-like positioning pattern may be provided on the motherboard with respect to each covering mask block and may be used for alignment with a corresponding strip-like positioning opening in the covering mask block. That is, the motherboard may have at least one first positioning pattern with respect to each graphic mask block and have at least one second positioning pattern with respect to each covering mask block.

Since the motherboard may have at least one first positioning pattern with respect to each graphic mask block and have at least one second positioning pattern with respect to each covering mask block, the fifth embodiment of the present disclosure provides a motherboard which can be used for positioning purpose in a process of manufacturing at least the mask according to the aforementioned first embodiment. On the motherboard, at least one first positioning pattern is provided for each graphic mask block and is used for positioning the graphic mask block. On the motherboard, at least one second positioning pattern is provided for each covering mask block and is used for positioning the covering mask block to cover the pixel shaping openings of the ineffective regions of adjacent graphic mask blocks.

III. Device and Method for Manufacturing a Mask

Figure 6:
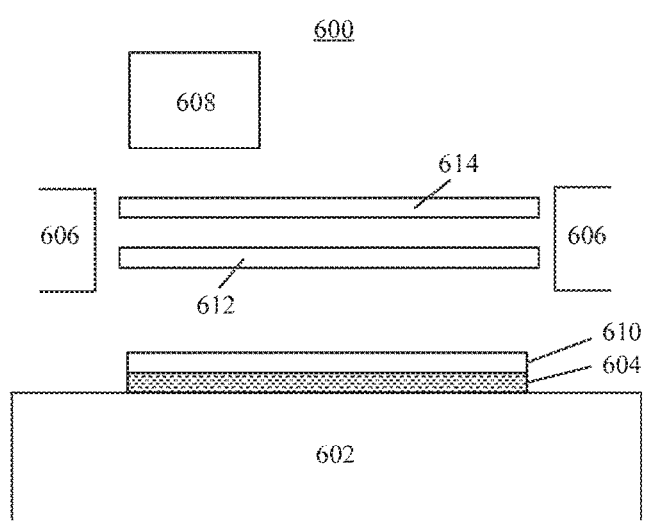
FIG. 6 is a schematic structural view of a device for manufacturing mask according to an embodiment of the present disclosure.

FIG. 6 is a schematic structural view of a device for manufacturing a mask according to an embodiment of the present disclosure. As shown in FIG. 6, the device 600 for manufacturing the mask comprises a base table 602, a motherboard 604, a stretcher 606 and a welding machine 608. The base table 602 is used to support the motherboard 604 and the mask frame 610. The motherboard 604 is used to position the covering mask layer and the graphic mask layer. This has been described in detail with reference to FIG. 5 and will not be described here. The stretcher 606 is used to perform a stretching treatment on the covering mask layer 612 and the graphic mask layer 614. The welding machine 608 is used to weld the positioned and stretched covering mask layer 612 and graphic mask layer 614 onto the mask frame 610, respectively. It may be implemented as, for example, a laser welding machine. That is, in addition to the motherboard 604, the base table 602, the stretcher 606 and the welding machine 608 may employ the same apparatuses or components as those for implementing the corresponding processes or functions in the conventional device for manufacturing mask. Thus, their detailed description will not be repeated here. The order in which the covering mask layer 612 and the graphic mask layer 614 are welded may be firstly welding the covering mask layer 612 and then welding the graphic mask layer 614, or its reverse order. It should be noted that although the mask frame 610 is shown as being placed above the motherboard 604 in FIG. 6, the mask frame 610 and the motherboard 604 may also be arranged in any other suitable manner (e.g., the mask frame 610 may surround the motherboard 604 and thus is located in the same plane as the motherboard 604, as long as the positioning can be achieved.

That is, the sixth embodiment of the present disclosure provides a device which can be used for manufacturing at least the mask according to the aforementioned third embodiment. The device includes the motherboard according to the aforementioned fifth embodiment and used for positioning the covering mask layer and the graphic mask layer, a base table for supporting the motherboard and the mask frame, a stretcher for performing a stretching treatment on the covering mask layer and the graphic mask layer, and a welding machine for welding the positioned and stretched covering mask layer and graphic mask layer onto the mask frame, respectively.

Optionally, the stretcher 606 may also perform a stretching treatment on the supporting mask layer described above, and the welding machine 608 may also weld the stretched supporting mask layer to the mask frame 610. The order in which the covering mask layer, the supporting mask layer and the graphic mask layer are welded may be firstly welding the covering mask layer and then welding the supporting mask layer and then welding the graphic mask layer, or may be any other suitable welding order.

Accordingly, the present disclosure also provides a method which can be used for manufacturing at least the mask according to the aforementioned third embodiment. The method includes, by using the motherboard according to the aforementioned fifth embodiment, positioning the covering mask layer and the graphic mask layer, by using a stretcher, performing a stretching treatment on the covering mask layer and the graphic mask layer, and by using a welding machine, welding the positioned and stretched covering mask layer and graphic mask layer onto the mask frame, respectively.

IV. System for Evaporating a Display Substrate

A system for evaporating a display substrate according to an embodiment of the present disclosure includes an evaporator, and the mask according to various embodiments of the present disclosure described above in section I and used for forming pixel patterns on a substrate on which at least one display region is usually arranged. In addition to the mask, other constituent equipment or components of the system for evaporating the display substrate may employ the same equipment or components as those for implementing the corresponding processes or functions in the conventional evaporation system. Thus, their detailed description will not be repeated here.

Since the mask according to various embodiments of the present disclosure described above in Section I is used, the thickness of the organic material layer of the display substrate obtained by performing evaporation using the system for evaporating the display substrate becomes more uniform, thereby mitigating the darkening in luminance at left and right sides of a display panel and improving the yield.

It should be noted that the embodiments described above are merely exemplary embodiments of the present disclosure, but are not used to limit the protection scope of the present disclosure. The protection scope of the present disclosure should be defined by the appended claims.

The invention claimed is:

1. A mask comprising: a graphic mask layer having a plurality of graphic mask blocks mutually spaced apart and arranged in parallel, and a covering mask layer having a plurality of covering mask blocks mutually spaced apart and arranged in parallel, the covering mask block covering a gap between adjacent graphic mask blocks, wherein the graphic mask block comprises an effective region, an ineffective region, and a marginal region between the effective region and the ineffective region, the effective region, the ineffective region and the marginal region each have a plurality of pixel shaping openings, and the covering mask block further covers the pixel shaping openings of the ineffective regions of the adjacent graphic mask blocks.

2. The mask according to claim 1, wherein the plurality of pixel shaping openings of the effective region are arranged in a form of a plurality of pixel shaping regions mutually spaced apart; and wherein the mask further comprises a supporting mask layer having a plurality of supporting mask blocks mutually spaced apart and arranged in parallel, the supporting mask block is arranged perpendicularly to a length direction of the graphic mask block, and a position of the supporting mask block corresponds to a gap between adjacent pixel shaping regions.

3. The mask according to claim 1, wherein the marginal region has one or two columns of pixel shaping openings.

4. The mask according to claim 1, wherein one of the covering mask block and the graphic mask block has at least one positioning opening, or each of the covering mask block and the graphic mask block has at least one positioning opening.

5. The mask according to claim 1, wherein the pixel shaping openings of the ineffective region and the marginal region have a same structure, size and arrangement as the pixel shaping openings of the effective region.

6. The mask according to claim 1, further comprising a mask frame on which the graphic mask layer and the covering mask layer are provided.

7. The mask according to claim 2, further comprising a mask frame on which the graphic mask layer, the covering mask layer and the supporting mask layer are provided.

8. A system for evaporating display substrate, comprising:
an evaporator; and
the mask according to claim 1.

9. A method for manufacturing the mask according to claim 6, comprising:

positioning, by a motherboard, the covering mask layer and the graphic mask layer, wherein at least one of the following is provided on the motherboard:
at least one first positioning pattern provided for each graphic mask block to position the graphic mask block; and
at least one second positioning pattern provided for each covering mask block to position the covering mask block to cover the pixel shaping openings of the ineffective regions of adjacent graphic mask blocks;

performing, by a stretcher, a stretching treatment on the covering mask layer and the graphic mask layer; and welding, by a welding machine, the positioned and stretched covering mask layer and graphic mask layer onto the mask frame, respectively.

10. The mask according to claim 2, wherein the marginal region has one or two columns of pixel shaping openings.

11. The mask according to claim 2, wherein one of the covering mask block and the graphic mask block has at least one positioning opening, or each of the covering mask block and the graphic mask block has at least one positioning opening.

12. The mask according to claim 3, wherein one of the covering mask block and the graphic mask block has at least one positioning opening, or each of the covering mask block and the graphic mask block has at least one positioning opening.

13. The mask according to claim 2, wherein the pixel shaping openings of the ineffective region and the marginal region have a same structure, size and arrangement as the pixel shaping openings of the effective region.

14. The mask according to claim 3, wherein the pixel shaping openings of the ineffective region and the marginal region have a same structure, size and arrangement as the pixel shaping openings of the effective region.

15. The mask according to claim 4, wherein the pixel shaping openings of the ineffective region and the marginal region have a same structure, size and arrangement as the pixel shaping openings of the effective region.

16. A method for manufacturing the mask according to claim 6, comprising:

positioning, by a motherboard, the covering mask layer and the graphic mask layer, wherein at least one of the following is provided on the motherboard:
at least one first positioning pattern provided for each graphic mask block to position the graphic mask block; and
at least one second positioning pattern provided for each covering mask block to position the covering mask block to cover the pixel shaping openings of the ineffective regions of adjacent graphic mask blocks, wherein the at least one first positioning pattern or the at least one second positioning pattern comprises at least two dot patterns that are mutually spaced apart and are used for alignment with at least two corresponding holes in the graphic mask block or the covering mask block;

performing, by a stretcher, a stretching treatment on the covering mask layer and the graphic mask layer; and welding, by a welding machine, the positioned and stretched covering mask layer and graphic mask layer onto the mask frame, respectively.

* * * * *